US006489816B1

United States Patent
Ma

(10) Patent No.: US 6,489,816 B1
(45) Date of Patent: Dec. 3, 2002

(54) FREQUENCY CONVERTER WITH DIRECT CURRENT SUPPRESSION

(75) Inventor: Ssu-Pin Ma, San Jose, CA (US)

(73) Assignee: Signia Technologies, Milpitas, CA (US)

( * ) Notice: Subject to any disclaimer, the term of this patent is extended or adjusted under 35 U.S.C. 154(b) by 0 days.

(21) Appl. No.: 09/948,514

(22) Filed: Sep. 7, 2001

(51) Int. Cl.⁷ ............................................... H03B 19/00
(52) U.S. Cl. ..................................................... 327/113
(58) Field of Search ................................ 327/113, 114, 327/133, 66, 89, 355, 359, 362; 455/209, 326; 323/315, 316

(56) References Cited

U.S. PATENT DOCUMENTS

| 5,241,227 A | * | 8/1993 | Jung et al. ................... 323/312 |
| 5,872,446 A | | 2/1999 | Cranford, Jr. et al. ....... 323/315 |
| 5,999,804 A | | 12/1999 | Forgues ........................ 455/333 |
| 6,029,060 A | | 2/2000 | Ashby .......................... 455/326 |
| 6,054,889 A | * | 4/2000 | Kobayashi .................... 327/357 |
| 6,057,714 A | * | 5/2000 | Andrys et al. ............... 327/105 |
| 6,300,845 B1 | * | 10/2001 | Zou ............................. 323/315 |

OTHER PUBLICATIONS

"Monolithic RF Active Mixer Design," K.L. Fong et al., *IEEE Transactions on Circuits and Systems –II: Analog and Digital Signal Processing*, vol. 46, No. 3, Mar. 1999, pp. 231–239.

"RF CMOS Mixer Design and Optimization for Wideband CDMA Application," S. Li et al., Mised–Signal Design, 2000, SSMSD, 2000 Southwest Symposium, pp. 45–50.

"A Novel 1.5–V CMOS Mixer," G. Giustolisi et al., VLSI 1998, pp. 113–117.

"A Charge–Injection Method for Gilbert Cell Biasing," L. A. MacEachern et al., Electrical and Computer Engineering, *IEEE*, vol. 1, 1998, pp. 365–368.

* cited by examiner

*Primary Examiner*—My-Trang Nu Ton
(74) *Attorney, Agent, or Firm*—Skjerven Morrill LLP

(57) ABSTRACT

A frequency converter circuit and method is disclosed. The circuit may comprise: two pairs of differential amplifying transistors; two current mirrors, wherein each of the two current mirrors is operable to feed a respective one of the two pairs of differential amplifying transistors; a further pair of differential amplifying transistors, wherein each transistor of the further pair of differential amplifying transistors is operable to feed a repective one of the two current mirrors; and a pair of bypass transistors connected in parallel with a controlling side of the two current mirrors, wherein the bypass transistors reduce a direct current component of a current being mirrored.

20 Claims, 5 Drawing Sheets

FREQUENCY CONVERTER WITH DIRECT CURRENT SUPPRESSION

FIELD OF THE INVENTION

The present invention relates generally to electronic circuits. The present invention relates more specifically to frequency converter circuits that may be implemented in CMOS (complementary metal-oxide semiconductor technology) or other semiconductor technologies and operated at RF (radio frequency).

BACKGROUND

Frequency converter circuits are well known in the electronics field and especially in the RF field. Frequency converter circuits are typically implemented as analog multiplier circuits and are used in many different applications such as modulators, demodulators, upconverters, downconverters and mixers, to name a few.

The use of MOS (metal-oxide semiconductor, including CMOS) offers benefits such as low cost and efficiency as compared with other technologies. However, the linear dynamic voltage range of MOS devices is quite limited. Moreover, significant bias current is required to keep MOS devices in a linear region. Furthermore, MOS devices limited to operation in a linear region operate at relatively small signal levels, and thus may be prone to noise pickup and may therefore be undesirable.

Provided input voltages are small, simple CMOS versions of a GC (Gilbert cell) circuit can be used as a frequency converter.

A conventional GC frequency converter is implemented with three differential-pair amplifiers. Two of the differential-pair amplifiers, which each receive a first differential input, are "stacked" on the third differential-pair amplifiers, which receive a second differential input. Each differential-pair amplifier is typically implemented with two transistors.

Typically, if the conventional GC frequency converter is used for an upconverting (modulating) application, the first differential input is the carrier (higher frequency) signal and the transistors of the upper differential pair amplifiers operate in a saturated (i.e., non-linear) region. The second differential input is a baseband signal (which has a much lower frequency than the carrier signal) and the transistors of the lower differential-pair amplifier operate in a linear region. A bias is set for the conventional GC frequency converter to provide a quiescent DC (direct current) that will place the transistors of the lower differential-pair amplifier in a good operating point with a suitable current. The correct current bias depends in particular upon the ratings of the transistors, geometry, and finger multiplier (or m-number) as is well known in the art.

FIG. 1 is a graph 200 illustrating voltage (horizontal axis, in volts) versus current (vertical axis, in microamps) for an exemplifying prior art GC frequency converter. Curve 201 represents current in one leg of the GC frequency converter and curve 202 represents current in the other leg. It should be noted that signal current at the operating point is small and the DC bias level must be appropriately set. Moreover, signal current is only a relatively small fraction of DC bias resulting in poor efficiency. Also, in order for the transistors of lower differential-pair amplifiers to remain firmly in the linear region, signal voltage must be limited to around 50mV, and actually even less voltage may be used if the bias current cannot be set with accuracy. The conditions thus described lead to a number of problems. Firstly, the bias current must be set with care and perhaps with expensive compensation. Secondly, the value of signal voltage which is allowed is too small, especially in a noisy digital signal environment. Thirdly, the second stage of the prior art GC frequency converter is also forced to operate at low signal levels, and therefore prone to noise for both input and output.

Thus, a need exists to provide frequency converter circuits that operate efficiently, with good linearity, and which support higher signal levels.

The publications listed below are considered relevant background material since alternative solutions or components are included in the application:

[1] Keng Leong Fong, Robert G. Meyer, "Monolithic RF active mixer design," IEEE Transactions On Circuits and Systems, Vol. 46, No. 3, March 1999, pp. 231–239.

[2] Shenggao Li, Jerasimos Zohios, Jung H Choi, Mohammed Ismail, "RF CMOS Mixer Design and Optimization For Wideband CDMA Application," Mixed-Signal Design, 2000. SSMSD, 2000 Southwest Symposium, pp. 45–50.

[3] G. Giustolisi, G. Palmisano, G. Palumbo, C. Strano, "A Novel 1.5-V CMOS Mixer," VLSI, 1998, pp. 113–117.

[4] Leonard A. MacEachern, Tajinder Manku, "A Charge-Injection Method for Gilbert Cell Biasing," Electrical and Computer Engineering, 1998. IEEE, Vol. 1, 1998, pp. 365–368.

[5] K.B. Ashby, "Mixer with current mirror load," U.S. Pat. No. 6,029,060, issued February 2000.

SUMMARY OF THE INVENTION

According to an aspect of the invention, a frequency circuit may be constructed using two pairs of differential amplifying transistors, two current mirrors, a further pair of differential amplifying transistors, and a pair of bypass transistors. Each transistor of the further pair of differential amplifying transistors is operable to feed a respective one of the two current mirrors. Each of the two current mirrors is operable to feed a respective one of the two pairs of differential amplifying transistors. The bypass transistors are connected in parallel with a controlling side of the two current mirrors so that the bypass transistors reduce a direct current component of a current being mirrored.

According to a further aspect of the invention, a bias generating circuit provides a first bias voltage for controlling a current passing through each transistor of the pair of bypass transistors and a second bias voltage for controlling the amount of direct current passing through the further pair of differential amplifying transistors.

According to a still further aspect of the invention, a method for mixing a first signal having a first frequency with a second signal having a second frequency is provided. Included in the method are providing a first differential amplifier for the first signal to produce an amplified first signal, providing a bypass circuit to reduce direct current associated with the amplified first signal to produce a biased signal, applying the biased signal to a current mirror to produce a mirrored signal and applying the mirrored signal and the second signal to a second differential amplifier to produce an output signal.

According to a still further aspect of the invention, a mixer circuit is provided that includes:

A first stage for generating a first current in response to a first frequency signal, the first stage comprising a first pair of differential amplifying transistors.

A current mirror for generating a second current which mirrors some portion of he first current.

A bypass circuit for reducing a direct current component of the first current so that a reduced direct current component is mirrored by the current mirror.

A second stage for generating an output signal in response to a second frequency signal and the mirrored current.

According to another aspect of the invention, a circuit is provided that uses a CMOS GC (Gilbert cell) with the first stage supplying current to an amplifying current mirror, wherein the driving side of the current mirror includes DC (direct current) bypass circuit to optimally place the quiescent current levels.

BRIEF DESCRIPTION OF THE DRAWINGS

For simplicity in description, identical components are labeled by the same numerals in this application.

DETAILED DESCRIPTION

Figure 1:
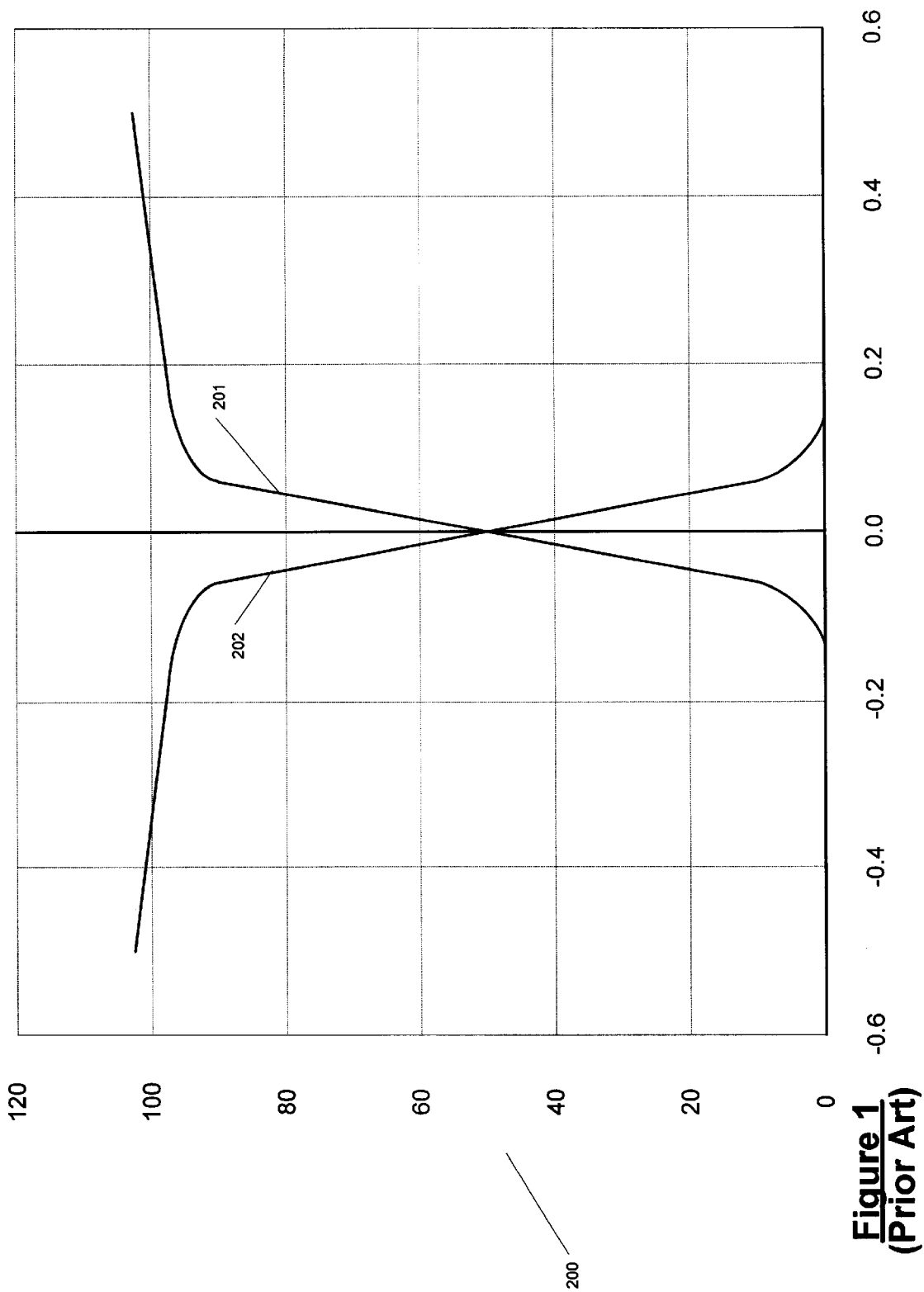
FIG. 1 is a graph illustrating voltage versus current for an exemplifying prior art GC frequency converter.
Figure 2:
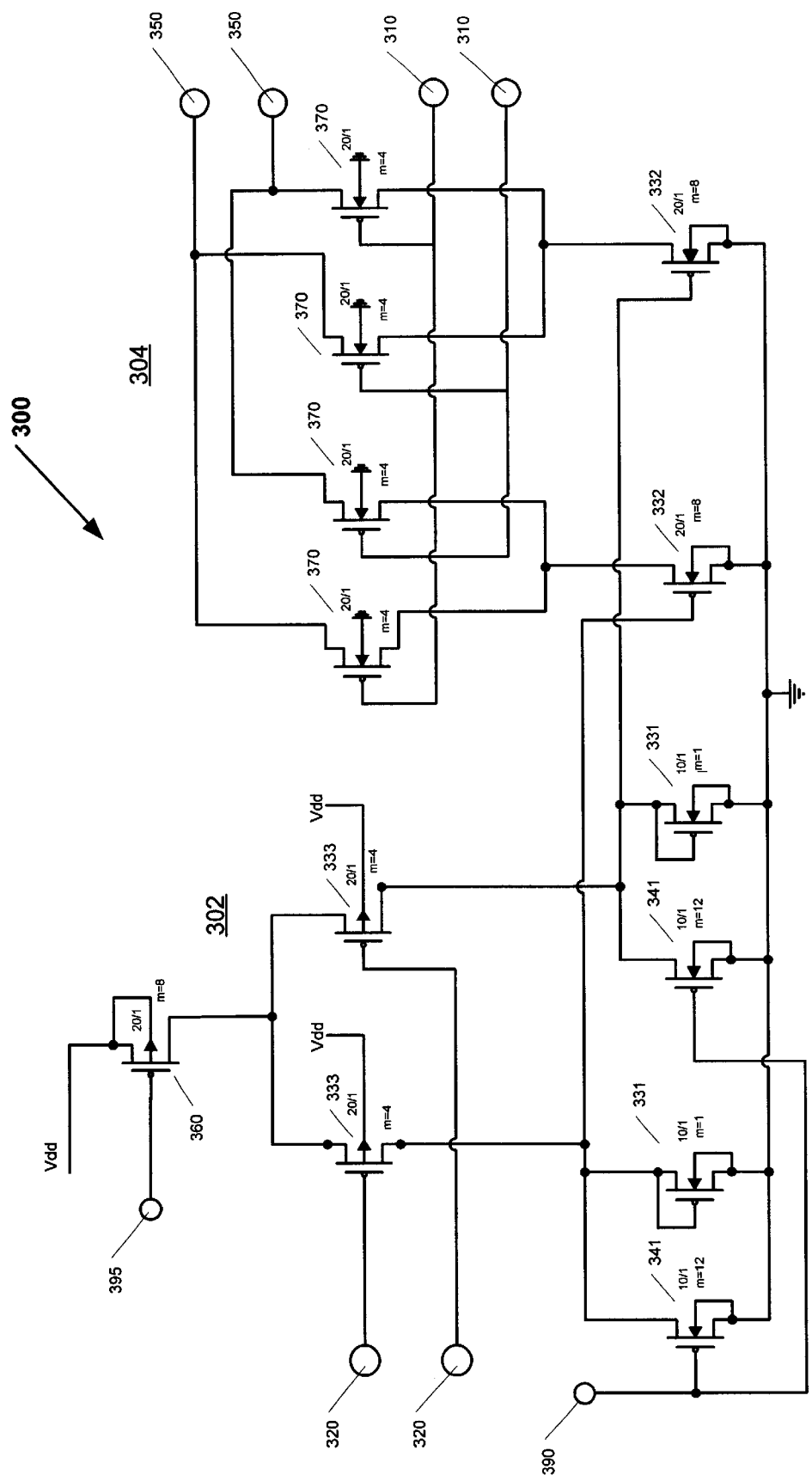
FIG. 2 is a schematic diagram of a frequency converter circuit with DC suppression, according to an embodiment of the invention.

FIG. 2 is a schematic diagram of a frequency converter circuit 300 with DC suppression, according to an embodiment of the invention. Frequency converter circuit 300 includes a first stage 302 and a second stage 304. The first stage 302 comprises an input port 320 and a pair of differential amplifying transistors 333. The second stage 304 comprises an input port 310, an output port 350, and two pairs of differential amplifying transistors 370. The second stage 304 is controlled by differential input signal presented at input port 310 and is further controlled by the currents due to the first stage 302. The four transistors 370 form two differential-pair amplifiers for driving output port 350.

The transistors 333 in the first stage 302 form a differential-pair amplifier. Input port 320 receives a differential signal that controls the first stage 302 using transistors 333 as differential amplifiers. Transistors 333 are biased to operate in a linear region, and thus may require a relatively small input signal. The signal current in the first stage 302 passes through transistors 331. Transistors 331 operate as amplifying current mirrors with transistors 332 that drive the second stage. In one embodiment, transistors 331 have a W/L (width/length) ratio of 10/1, whereas transistors 332 have a W/L ratio of 20/1. Also, each transistor 331 has a finger (m-number) of 1, while each transistor 332 has a finger of 8. Consequently, the current in transistors 331 is amplified sixteen (16) times when mirrored by transistors 332. Because transistors 332 are operated as a current mirror rather than as a transconductance amplifier, they are not operated in a linear region, and thus can carry the large current generated by the 16:1 amplification.

This permits the signals at input port 310 and at output port 350 to be relatively robust signals, thus providing a noise pickup improvement over previously developed frequency converter designs.

Still referring to FIG. 2, a substantial DC bias required to place transistors 333 of the first stage 302 in the linear region of operation. If that quiescent DC were amplified into the second stage it would create significant thermal load and inefficiency in the second stage 304. Bypass transistors 341 are provided for removing DC from the current mirrors. That is, bypass transistors 341 are not included in the current mirrors because they are not configured with their bases connected to their sources. Rather, transistors 341 operate with constant current according to the bias set at a bias control port 390. Optimally, transistors 341 are biased to conduct sufficient current so that only the signal component of the current through transistors 333 is carried by transistors 331 and mirrored into the second stage 304. Thus, transistors 341 are biased such that transistors 331 are nearly, but not quite, cut-off during the most extreme signal excursion. A bias setting transistor 360 is controlled by the signal applied at a bias input 395 and sets the total DC through the first stage 302. Thus, the (quiescent) DC is split into two equal parts—one through each of transistors 333.

Figure 3:
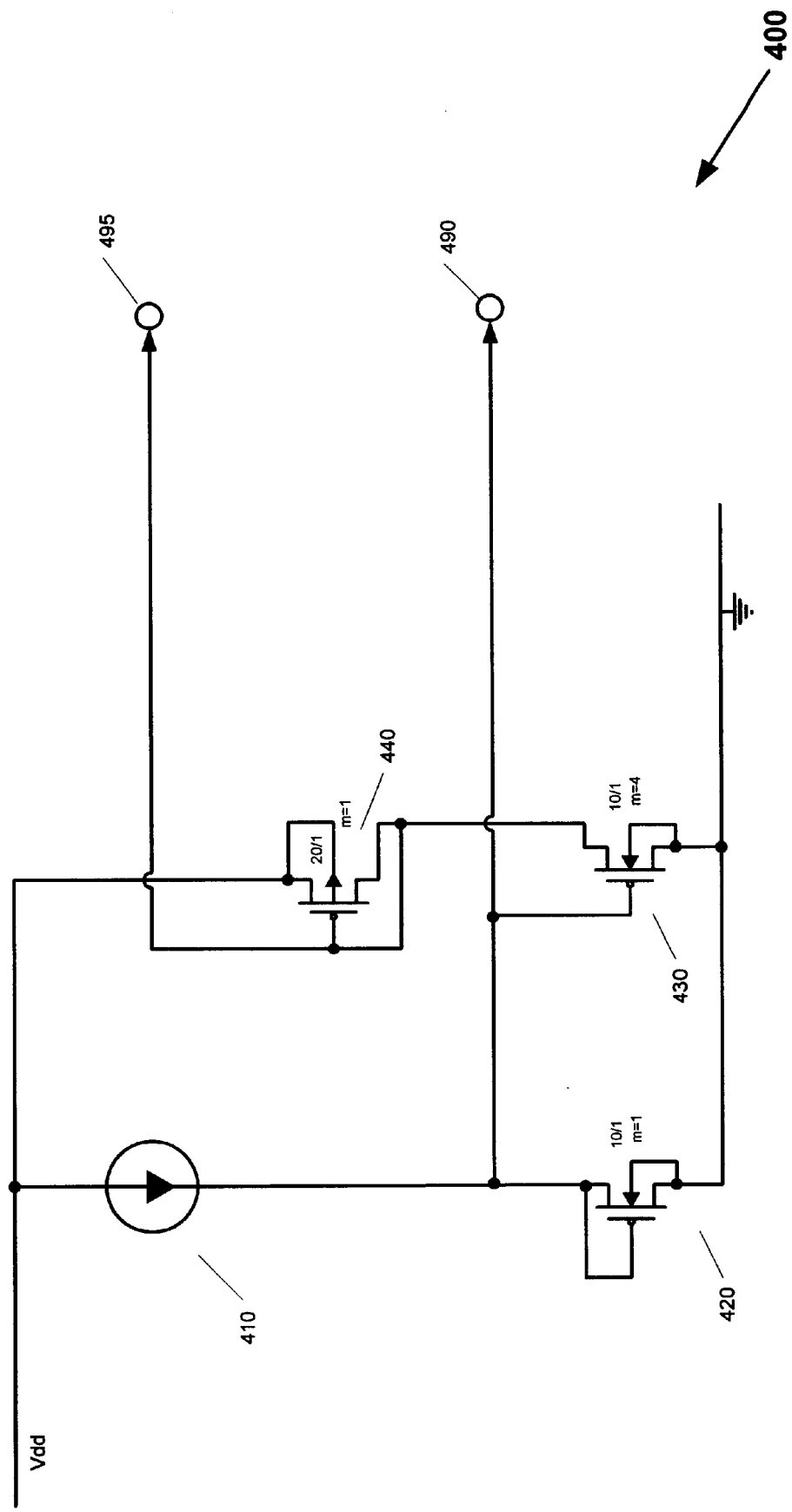
FIG. 3 is a schematic diagram of a biasing circuit for use with the frequency converter circuit of FIG. 2.

FIG. 3 is a schematic diagram of a biasing circuit for use with the frequency converter circuit of FIG. 2. A constant current source 410 is used as a reference from which bias currents are derived. In one embodiment, the constant current source may generate a DC of 3 microamperes. Technologies for constant current sources are well known in the art, for example, using CMOS processes. The reference DC from constant current source 410 flows through a transistor 420 and is mirrored into a transistor 430 with a 4:1 ratio due to their similar geometry and a finger number of 4 for transistor 430 versus 1 for transistor 420. The controlling bias also goes to a bias output port 490, and in a typical embodiment, may be connected to input bias port 390 of the frequency converter circuit 300 (FIG. 2).

Still referring to FIG. 3, if constant current source 410 generates 3 microamperes then 12 microamperes flows through transistors 430 and 440. Transistor 440 provides the voltage level to bias output port 495, which may be connected to input bias port 395 of the frequency converter circuit 300 (FIG. 2).

Referring to FIGS. 2 and 3, and with respective bias ports connected, it can be seen that, in the exemplary embodiment, DC bypass transistors 341 have a W/L ratio of 10/1 and a finger of 12, whereas bias generating transistor 420 has a W/L ratio of 10/1 and a finger of 1. Therefore, as is apparent to one of ordinary skill in the art, in the exemplary case of constant current source 410 generating 3 microamperes, then each of the two transistors 341 will bypass 36 microamperes. Similarly, transistor 440 has a W/L ratio of 20/1 and a finger of 1, whereas transistor 360 has a W/L ratio of 20/1 and a finger of 8. Thus, in this example of constant current source 410 generating 3 microamperes, then 12 microamperes flow through transistor 440 and 96 microamperes flow through transistor 360. Referring back to FIG. 2, if 96 microamperes DC flow through transistor 360, then 48 microamperes DC passes through each of the two transistors 333. Pursuing the example, 36 microamperes is bypassed through transistor 341, leaving 12 microamperes (DC quiescent) in transistor 331. This 12 microamperes DC is mirrored 16:1 by transistors 332 as a DC bias of 184 microamps, thus allowing transistors 332 to carry a signal of 300 microamperes peak-to-peak with comfortable headroom. 300 microamperes peak-to-peak signal at transistor 332 corresponds to approximately 19 microamperes peak-to-peak signal at transistor 333. Since, as seen in the example, transistor 333 may have a DC bias of 48 microamperes, a 19 microamperes peak-to-peak signal can readily be accommodated with excellent linearity.

Figure 4:
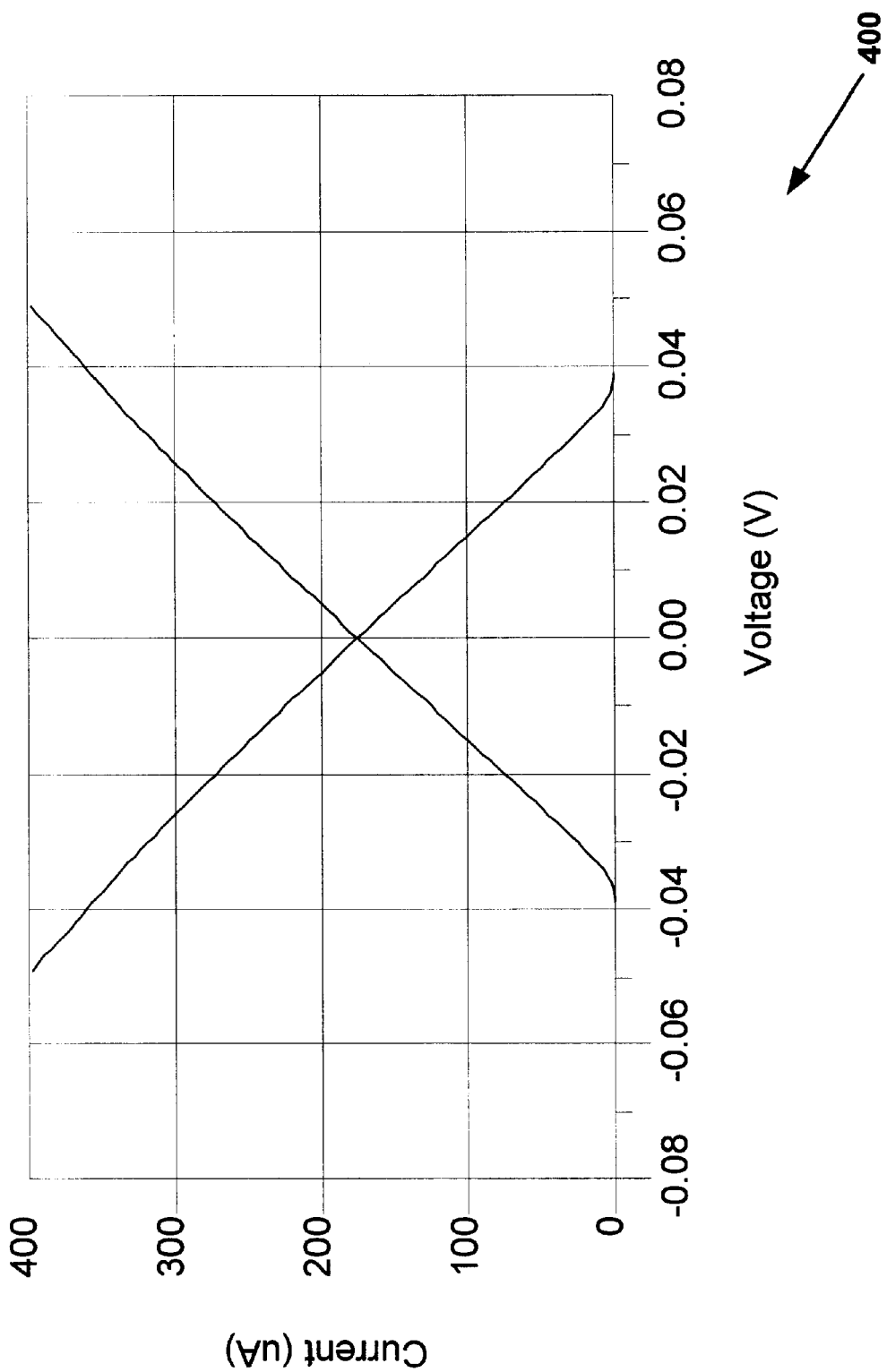
FIG. 4 is a graph illustrating voltage versus current for a stage of an exemplary implementation of the frequency converter circuit, according to an embodiment of the present invention.

FIG. 4 shows a graph 400 of voltage (horizontal axis, volts) against current (vertical axis, microamps) illustrating the performance of the complete first stage of an exemplary embodiment of the inventive frequency changer. It is readily apparent to one of ordinary skill in the art that FIG. 4 shows how robust output signals are generated with good linearity and near optimal DC biasing.

Figure 5:
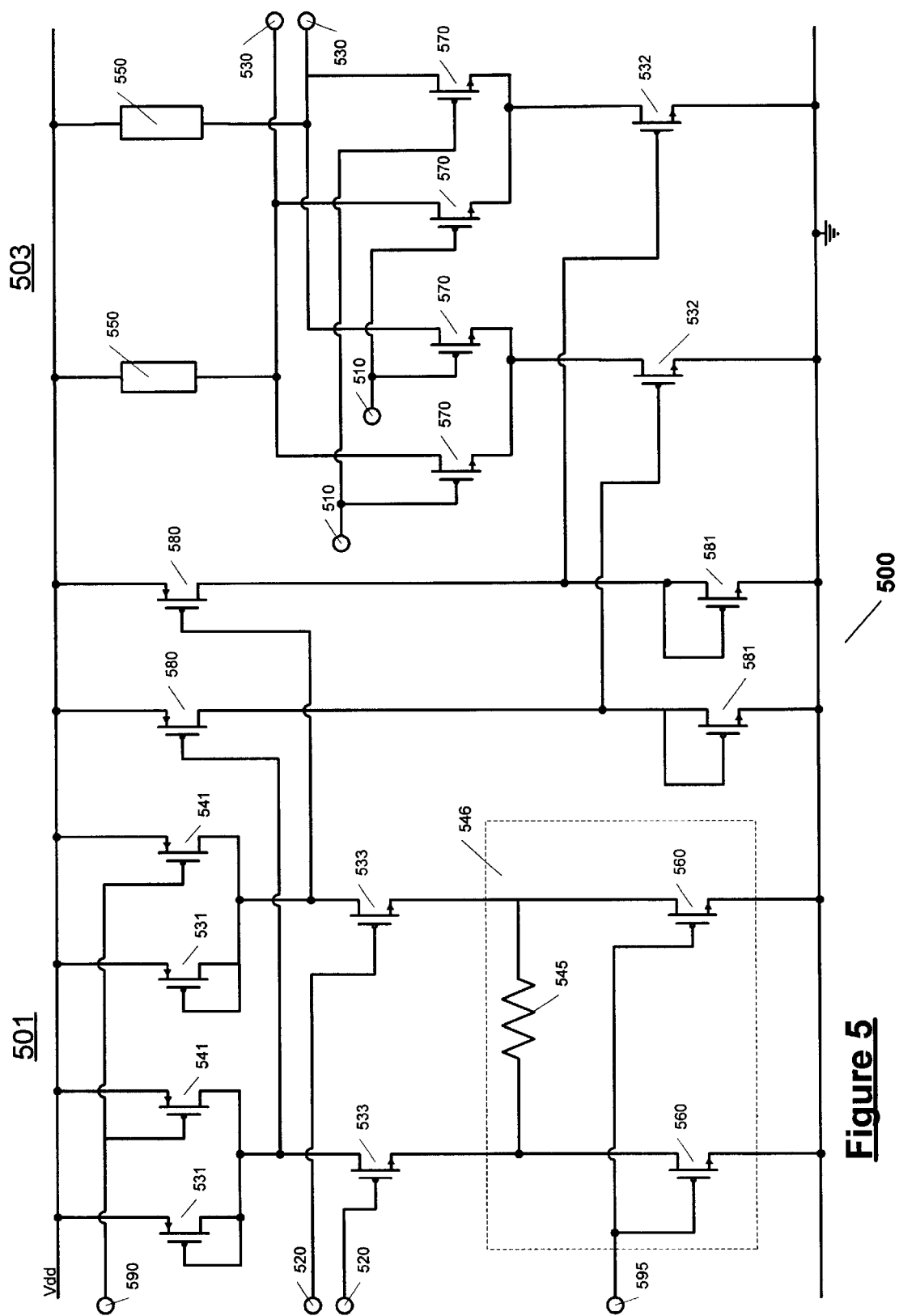
FIG. 5 is a schematic diagram of a frequency converter according to a further embodiment of the invention.

FIG. 5 is a schematic diagram of an exemplary frequency converter circuit 500 according to a further embodiment of the invention. The presence of various refinements and variations in circuit 500 is apparent to one of ordinary skill in the art. The frequency converter circuit 500 may use N-channel MOSs 533, 570 for the differential amplifiers of both first stage 501 and second stage 503. Differential input port 520 controls the two transistors 533 of the differential amplifier of the first stage 501. Differential input port 510 controls the four transistors 570 of the pair of differential amplifiers of the second stage 503. Transistors 570 work against loads 550 to form an output signal at output port 530. Loads 550 provide output loading and may be embodied in any of various forms, as is well-known in the art, examples of loads include resistors, inductors, transistors, current sources, or the input loads of the next stage(s) to which the output port 530 may be connected.

In the particular embodiment shown in FIG. 5, a source degradation resistor 545 is provided. Source degradation is a well-known technique in the art, it effectively allows the differential signal voltage present at input port 520 to be split. Part of the signal voltage at input port 520 may be developed across a gate and source of each of transistors 533 and a further part of the signal voltage may be developed across degradation resistor 545. This refinement of source degradation permits a larger signal to be presented (with good linearity) at the input port 520 than would otherwise be the case and so undesirable noise pickup may be diminished.

In the particular embodiment shown in FIG. 5, bias setting transistors 560 set the DC in the first stage and thus the quiescent DC level in the differential amplifier transistors 533 and thus may regulate the operating point of the differential amplifier transistors 533. Bias setting transistors 560 are controlled by a bias control voltage present at bias control input port 595.

Still referring to the embodiment shown in FIG. 5, signal current in the first stage 501 is controlled by transistors 533 responsive to voltage at input port 520 and this signal current passes through transistors 531. Transistors 531 operate as a first pair of current mirrors with transistors 580. As can be seen by an inspection of FIG. 5, the current mirrored into transistors 580 also passes through transistors 581 which operate as the controlling side of a second current mirror. Transistors 581 operate as current mirrors with transistors 532 to drive signal current that is due to the first stage 501 into the second stage 503. Bypass transistors 541 act to divert an amount of DC from transistors 531 so as to avoid mirroring an excess amount of DC into transistors 580 and hence into the second stage.

Other variations of the circuit of FIG. 5 will be apparent to those of skill in the art. For example the group 546 of components consisting of degradation resistor 545 and bias setting transistors 560 arranged in a "Pi" circuit could readily be replaced with a group of two resistors and one transistor arranged in a "T" circuit. As a further example bypass transistors could be configured in parallel with transistors of the second current mirror as an alternative to (or even in addition to) transistors of the first current mirror. That is bypass transistors could be placed in parallel with transistors 581 instead of (or in addition to) in parallel with transistors 541. A still further example would be the introduction of source degradation into the second stage.

It should be appreciated that the ratios of geometries, finger numbers, and absolute values of currents described herein are exemplary only, and that many other values and proportions are possible within the general scope of the invention.

This disclosure is illustrative and not limiting. Further modifications will be apparent to one skilled in the art in the light of this disclosure and are intended to fall within the scope of the appended claims. For example, other technologies such as BJTs (bipolar junction transistors), JFETs (junction field effect transistors), etc., are envisaged and techniques for adapting circuits designed for MOS to other technologies are well-known. Also the inventive aspect of bypassing DC bias from a current mirror could be applied to circuit subsets such as, for example, a single-balanced modulator for AM (amplitude modulation), and to other applications.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A circuit comprising:
   two pairs of differential amplifying transistors;
   two current mirrors, wherein each of the two current mirrors is operable to feed a respective one of the two pairs of differential amplifying transistors;
   a further pair of differential amplifying transistors, wherein each transistor of the further pair of differential amplifying transistors is operable to feed a respective one of the two current mirrors; and
   a pair of bypass transistors connected in parallel with a controlling side of the two current mirrors, wherein the bypass transistors reduce a direct current component of a current being mirrored.

2. The circuit of claim 1 wherein the transistors of the further pair of differential amplifying transistors operate in a linear region.

3. The circuit of claim 1 wherein the differential amplifying transistors comprise metal-oxide semiconductor transistors.

4. The circuit of claim 1 wherein the differential amplifying transistors comprise bipolar junction transistors.

5. The circuit of claim 1 wherein the differential amplifying transistors comprise junction field effect transistors.

6. The circuit of claim 1 wherein the circuit operates as an upconverting modulator.

7. The circuit of claim 1 wherein the circuit operates as a mixer.

8. The circuit of claim 1 further comprising a bias generating circuit for generating a first bias voltage and a second bias voltage wherein:
   the first bias voltage controls a current passing through each transistor of the pair of bypass transistors; and
   the second bias voltage controls the amount of direct current passing through the further pair of differential amplifying transistors.

9. A method for mixing a first signal having a first frequency with a second signal having a second frequency, the method comprising:

provided a first differential amplifier for the first signal to produce an amplified first signal;

providing a bypass circuit to reduce direct current associated with the amplified first signal to produce a biased signal;

applying the biased signal to a current mirror to produce a mirrored signal; and applying the mirrored signal and the second signal to a second differential amplifier to produce an output signal.

10. The method of claim 9 wherein the first differential amplifier is operated in a linear mode.

11. The method of claim 9 wherein the second differential amplifier is operated in a non-linear mode.

12. A circuit comprising:

two pairs of differential amplifying transistors;

at least two current mirrors, wherein each of two current mirrors selected from the at least two current mirrors is operable to feed a respective one of the two pairs of differential amplifying transistors;

a further pair of differential amplifying transistors, wherein each transistor of the farther pair of differential amplifying transistors is operable to feed a respective one of each of two current mirrors selected from the at least two current mirrors; and a pair of bypass transistors connected in parallel with a controlling side of each of two current mirrors selected from the at least two current mirrors, wherein the bypass transistors reduce a direct current component of a current being mirrored, wherein the current being mirrored conveys a signal from the further pair of differential amplifying transistors to the two pairs of differential amplifying transistors.

13. The circuit of claim 12 wherein the differential amplifying transistors comprise metal-oxide semiconductor transistors.

14. The circuit of claim 12 wherein the differential amplifying transistors comprise bipolar junction transistors.

15. The circuit of claim 12 wherein the differential amplifying transistors comprise junction field effect transistors.

16. The circuit of claim 12 wherein the circuit operates as an upconverting modulator.

17. The circuit of claim 12 wherein the circuit operates as a mixer.

18. A circuit comprising:

a first stage for generating a first current in response to a first frequency signal, the first stage comprising a first pair of differential amplifying transistors;

a current mirror for generating a second current which mirrors some portion of the first current;

a bypass circuit for reducing a direct current component of the first current so that a reduced direct current component is mirrored by the current mirror; and a second stage for generating an output signal in response to a second frequency signal and the second current.

19. The circuit of claim 18 wherein:

the circuit is adapted to operate as a double-balanced mixer.

20. The circuit of claim 18 wherein:

the circuit is adapted to operate as a single-balanced mixer.

* * * * *